United States Patent
Kim et al.

(10) Patent No.: US 8,692,240 B2
(45) Date of Patent: Apr. 8, 2014

(54) PHOTOELECTRIC CONVERSION FILM, PHOTOELECTRIC CONVERSION DEVICE AND COLOR IMAGE SENSOR HAVING THE PHOTOELECTRIC CONVERSION DEVICE

(71) Applicants: Samsung Electronics Co., Ltd., Suwon-si (KR); Osaka University, Osaka (JP)

(72) Inventors: Kyu-sik Kim, Yongin-si (KR); Masahiro Hiramoto, Osaka (KR)

(73) Assignees: Samsung Electronics Co., Ltd. (KR); Osaka University (JP)

( * ) Notice: Subject to any disclaimer, the term of this patent is extended or adjusted under 35 U.S.C. 154(b) by 0 days.

(21) Appl. No.: 13/667,820

(22) Filed: Nov. 2, 2012

(65) Prior Publication Data

US 2013/0082250 A1    Apr. 4, 2013

Related U.S. Application Data

(62) Division of application No. 12/417,934, filed on Apr. 3, 2009, now Pat. No. 8,319,207.

(30) Foreign Application Priority Data

Nov. 3, 2008   (KR) .................. 10-2008-0108509

(51) Int. Cl.
*H01L 51/00* (2006.01)
(52) U.S. Cl.
USPC ......................... 257/40; 257/E51.026
(58) Field of Classification Search
None
See application file for complete search history.

(56) References Cited

U.S. PATENT DOCUMENTS

| | | | |
|---|---|---|---|
| 2001/0028962 A1* | 10/2001 | Hirai | 428/690 |
| 2006/0071253 A1 | 4/2006 | Nii | |
| 2007/0057339 A1 | 3/2007 | Mitsui | |
| 2009/0294761 A1 | 12/2009 | Kim | |

FOREIGN PATENT DOCUMENTS

| | | |
|---|---|---|
| KR | 1020050116147 | 12/2005 |
| KR | 100670857 | 1/2007 |

* cited by examiner

*Primary Examiner* — Ha Tran T Nguyen
*Assistant Examiner* — Kevin Quinto
(74) *Attorney, Agent, or Firm* — Cantor Colburn LLP (57) ABSTRACT

A blue color photoelectric conversion film includes: a p-type layer formed by depositing tetracene; a p,n-type layer formed by co-depositing tetracene and naphthalene-tetracarboxylic-dianhydride ("NTCDA") on the p-type layer; and an n-type layer formed by depositing NTCDA on the p,n-type layer.

10 Claims, 5 Drawing Sheets

PHOTOELECTRIC CONVERSION FILM, PHOTOELECTRIC CONVERSION DEVICE AND COLOR IMAGE SENSOR HAVING THE PHOTOELECTRIC CONVERSION DEVICE

CROSS-REFERENCE TO RELATED APPLICATION

This application is a divisional of U.S. patent application Ser. No. 12/417,934, filed on Apr. 3, 2012, which claims priority to Korean Patent Application No. 10-2008-0108509, filed on Nov. 3, 2008, and all the benefits accruing therefrom under 35 U.S.C. §119, the contents of which in their entirety are herein incorporated by reference.

BACKGROUND

1. Field

This disclosure relates to a photoelectric conversion film, a photoelectric conversion device including the photoelectric conversion film, and a color image sensor including the photoelectric conversion device.

2. Description of the Related Art

Light receiving devices are used in digital cameras, broadcasting cameras, surveillance cameras, computer web cameras, camcorders, automotive sensors, household sensors and solar batteries. Generally, such light receiving devices include a micro lens, a color filter and a Si-optical diode. In these structures, a pixel size can be reduced and thus a light quantity reaching the Si-optical diode decreased, thereby causing a decrease in the performance of the light receiving device. As a result, the light receiving device can have low sensitivity, exhibit a false color phenomenon, a moiré phenomenon and low resolution.

Accordingly, there remains a need in the art for devices and methods which can have an increased number of pixels compared with that of the light receiving device. Increasing the number of pixels can provide improved definition and improved efficiency in the use of light.

SUMMARY

One or more embodiments include a photoelectric conversion film, a photoelectric conversion device including the photoelectric conversion film, and a color image sensor including the photoelectric conversion device.

To achieve the above and/or other aspects, one or more embodiments can include a blue color photoelectric conversion film including: a p-type layer formed by depositing tetracene; a p,n-type layer formed by co-depositing tetracene and naphthalene-tetracarboxylic-dianhydride ("NTCDA") on the p-type layer; and an n-type layer formed by depositing NTCDA on the p,n-type layer.

In an embodiment, the photoelectric conversion device can include: a pair of electrodes; and the above disclosed blue color photoelectric conversion film interposed between the pair of electrodes, wherein the pair of electrodes includes a first electrode disposed adjacent to the p-type layer and a second electrode disposed adjacent to the n-type layer.

The first electrode can be a transparent electrode including indium tin oxide ("ITO"), indium zinc oxide ("IZO"), ZnO, $SnO_2$, antimony-doped tin oxide ("ATO"), Al-doped zinc oxide ("AZO"), gallium-doped zinc oxide ("GZO"), $TiO_2$, fluorine-doped tin oxide ("FTO") or a combination including at least one of the foregoing, and the second electrode can be the same as the transparent electrode or can be a metal electrode including Al, Cu, Ti, Au, Pt, Ag, Cr or a combination including at least one of the foregoing.

The photoelectric conversion device can further include a buffer layer, a hole transfer layer or an electron transfer layer interposed between the first electrode and the blue color photoelectric conversion film or the second electrode and the blue color photoelectric conversion film.

In an embodiment, a color image sensor can include the photoelectric conversion device disclosed above.

Also disclosed is a blue color photoelectric conversion film including: a p-type layer formed by depositing tetraphenyl diamine ("TPD"); a p,n-type layer formed by co-depositing TPD and $C_{60}$ on the p-type layer; and an n-type layer formed by depositing NTCDA on the p,n-type layer.

Also disclosed is a green color photoelectric conversion film including: a p-type layer formed by depositing TPD; a p,n-type layer formed by co-depositing TPD and N-methyl-3,4,9,10-perylenetetracarboxyl-diimide ("Me-PTC") on the p-type layer; and an n-type layer formed by depositing NTCDA on the p,n-type layer.

Also disclosed is a photoelectric conversion device including: a pair of electrodes; and the green color photoelectric conversion film disclosed above interposed between the pair of electrodes, wherein the pair of electrodes includes a first electrode adjacent to the p-type layer and a second electrode adjacent to the n-type layer.

In an embodiment, selective photoelectric conversion of a blue wavelength, a green wavelength is disclosed and a photoelectric conversion device having an organic thin film layered structure, which can have high external quantum efficiency at a blue wavelength region, is disclosed. In addition, since the photoelectric conversion films are layered, the disclosed photoelectric conversion device can increase a number of pixels, improve definition and increase efficiency in the use of light.

These and other features, aspects and advantages of the disclosed embodiments will become better understood with reference to the following description and appended claims.

BRIEF DESCRIPTION OF THE DRAWINGS

The foregoing and other aspects, features and advantages will become apparent and more readily appreciated from the following description of the embodiments, taken in conjunction with the accompanying drawings in which.

DETAILED DESCRIPTION

Aspects, advantages and features of the present invention and methods of accomplishing the same can be understood more readily by reference to the following detailed description of preferred embodiments and the accompanying drawings. The present invention can, however, be embodied in many different forms, and should not be construed as being limited to the embodiments set forth herein. Rather, these embodiments are provided so that this disclosure will be thorough and complete and will fully convey the concept of the invention to those skilled in the art, and the present invention will only be defined by the appended claims.

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. As used herein, the term "and/or" includes any and all combinations of one or more of the associated listed items.

It will be understood that, although the terms first, second, third, etc., can be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "below", "lower", "upper" and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "lower" relative to other elements or features would then be oriented "above" relative to the other elements or features. Thus, the exemplary term "below" can encompass both an orientation of above and below. The device can be otherwise oriented (rotated 90 degrees or at other orientations) and the spatially relative descriptors used herein interpreted accordingly.

As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation can result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Reference will now be made in detail to exemplary embodiments, which are further illustrated in the accompanying drawings, wherein like reference numerals refer to the like elements throughout, and the sizes and thicknesses of layers and regions are exaggerated for clarity.

Hereinafter, the embodiments relate to a light receiving device used in a camera, an image sensor, and an organic thin film solar battery, and more particularly, to a photoelectric conversion film functioning as a photoelectric converter in a light receiving device, a photoelectric conversion device using the photoelectric conversion film and a color image sensor.

Figure 1:
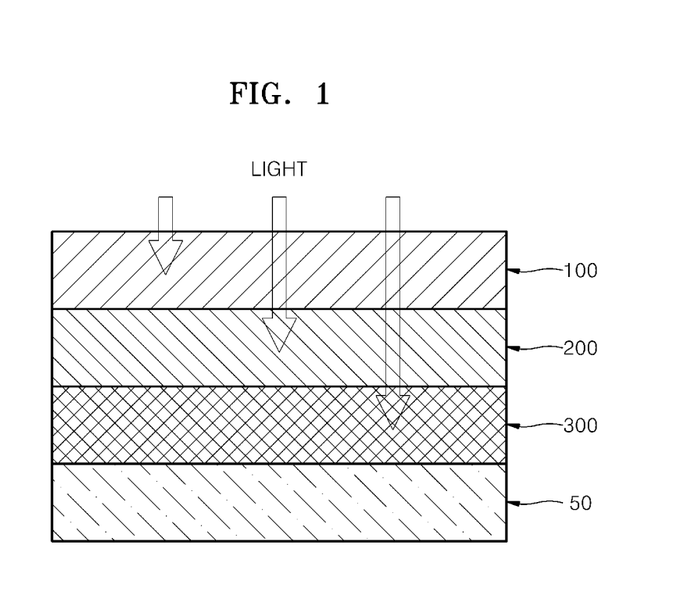
FIG. 1 is a cross-sectional view schematically illustrating an exemplary embodiment of a photoelectric conversion device.

FIG. 1 is a cross-sectional view schematically illustrating an exemplary embodiment of a photoelectric conversion device.

Referring to FIG. 1, the photoelectric conversion device has a layered structure in which a red color photoelectric conversion device 300, a green color photoelectric conversion device 200, and a first blue color photoelectric conversion device 100 are sequentially disposed on a complementary metal-oxide-semiconductor ("CMOS") substrate 50. In an embodiment of the photoelectric conversion device, colors of light respectively corresponding to the first blue, green, and red photoelectric conversion devices 100, 200 and 300, respectively, are filtered at the first blue, green and red photoelectric conversion devices 100, 200 and 300, respectively, and are converted into electric current.

Figure 2A:
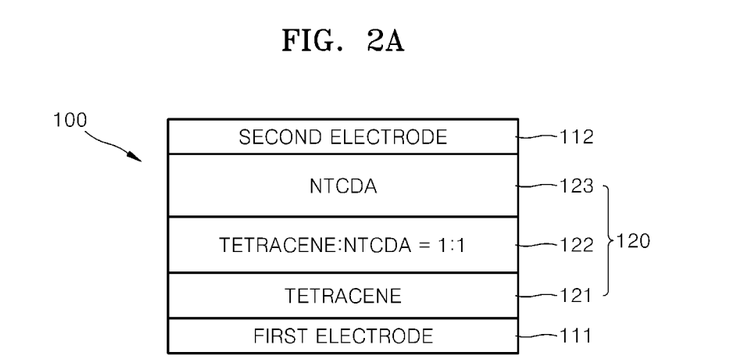
FIG. 2A is a cross-sectional view illustrating a blue color photoelectric conversion device of FIG. 1.

FIG. 2A is a cross-sectional view illustrating the first blue color photoelectric conversion device 100 of FIG. 1.

Referring to FIG. 2A, the first blue color photoelectric conversion device 100 includes a pair of first and second electrodes 111 and 112, respectively, and a blue color photoelectric conversion film 120 interposed between the first electrode 111 and the second electrode 112, wherein the first electrode 111 and the second electrode 112 are disposed spaced apart from each other. In this embodiment, the blue color photoelectric conversion film 120 includes a p-type layer 121, a p,n-type layer 122 and an n-type layer 123, wherein the p-type layer 121 is formed by depositing tetracene on the first electrode 111, the p,n-type layer 122 is formed by co-depositing tetracene and naphthalene-tetracarboxylic-dianhydride ("NTCDA") on the p-type layer 121, and the n-type layer 123 is formed by depositing NTCDA on the p,n-type layer 122.

In an embodiment, tetracene can be used to form the p-type layer 121 by deposition. Also, tetracene and NTCDA can be used to form the p,n-type layer 122 on the p-type layer 121 by co-deposition. In addition, NTCDA can be used to form the n-type layer 123 on the p,n-type layer 122 by deposition. In an embodiment, the p,n-type layer 122 is formed from tetracene and NTCDA and tetracene and NTCDA can be mixed in a ratio of one to one. However, the present embodiment is not limited thereto.

The first electrode 111 can be adjacent to the p-type layer 121 and the second electrode 112 can be adjacent to the n-type layer 123. In an embodiment, the first electrode 111 can be a transparent electrode and can comprise a material such as indium tin oxide ("ITO"), indium zinc oxide ("IZO"), ZnO, $SnO_2$, antimony-doped tin oxide ("ATO"), Al-doped zinc oxide ("AZO"), gallium-doped zinc oxide ("GZO"), $TiO_2$, fluorine-doped tin oxide ("FTO") or the like, or a combination thereof. In an embodiment, the first electrode 111 can consist essentially of a material such as ITO, IZO, ZnO, $SnO_2$, ATO, AZO, GZO, $TiO_2$, FTO or the like, or a combination thereof. In another embodiment, the first electrode 111 can consist of a material such as ITO, IZO, ZnO, $SnO_2$, ATO, AZO, GZO, $TiO_2$, FTO or the like, or a combination thereof. The second electrode 112 can be the same as the transparent electrode described above or can be a metal electrode comprising a material such as Al, Cu, Ti, Au, Pt, Ag, Cr or the like, or a combination thereof. In an embodiment the second electrode 112 can consist essentially of a material such as Al, Cu, Ti, Au, Pt, Ag, Cr or the like, or a combination thereof. In another embodiment the second electrode 112 can consist of a material such as Al, Cu, Ti, Au, Pt, Ag, Cr or the like, or a combination thereof.

In the first blue color photoelectric conversion device 100, the p-type layer 121 can be formed by depositing tetracene with a thickness, for example, between about 10 nanometers ("nm") and about 50 nm, specifically between about 20 nm and about 40 nm, more specifically about 30 nm on the first electrode 111 (for example, an ITO electrode) disposed on a glass substrate (not shown). Also, the p,n-type layer 122 can be formed by co-depositing tetracene and NTCDA with a thickness between about 10 nm and about 200 nm, specifically between about 50 nm and about 150 nm, more specifically about 100 nm on the p-type layer 121. In addition, the n-type layer 123 can be formed by depositing NTCDA with a thickness between about 50 nm and about 500 nm, specifically between about 100 nm and about 400 nm, more specifically about 250 nm on the p,n-type layer 122. In an embodiment, the second electrode 112 (for example, an Ag electrode) can be disposed with a thickness between about 5 nm and about 50 nm, specifically between about 10 nm and about 40 nm, more specifically about 20 nm on the n-type layer 123. The thickness of each layer is not limited thereto and can vary.

The first blue color photoelectric conversion device 100 can have a high external quantum efficiency within a blue wavelength region. In an embodiment, a high external quantum efficiency is observed at a wavelength between about 400 nm and about 500 nm. More specifically, about 60 percent ("%") or greater external quantum efficiency is observed at a wavelength of about 500 nm and about 45% or greater external quantum efficiency is observed at a wavelength of about 450 nm.

In an embodiment, the blue color photoelectric conversion film 120 can comprise a p-type layer formed by depositing tetracene and an n-type layer formed by depositing NTCDA on the p-type layer. In an embodiment, the blue color photoelectric conversion film 120 can consist essentially of a p-type layer formed by depositing tetracene and an n-type layer formed by depositing NTCDA on the p-type layer. In an embodiment, the blue color photoelectric conversion film 120 can consist of a p-type layer formed by depositing tetracene and an n-type layer formed by depositing NTCDA on the p-type layer. In addition, instead of using NTCDA, Bathocuproine ("BCP") or 8-hydroxy-quinoline aluminum complex ("$Alq_3$") can be used. Moreover, in order to improve the performance of the photoelectric conversion device, a buffer layer or a hole transfer layer can be further included between the first electrode 111 and the p-type layer 121, and a buffer layer or an electron transfer layer can be further included between the second electrode 112 and the n-type layer 123. In an embodiment, the buffer layer, the hole transfer layer and the electron transfer layer can include an inorganic material, an organic material or combination thereof.

Figure 2B:
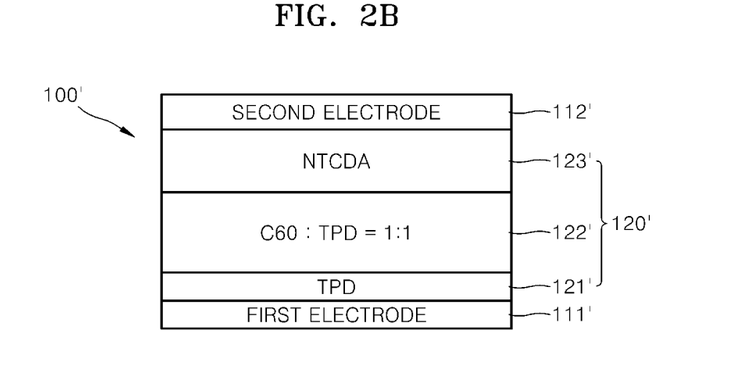
FIG. 2B is a cross-sectional view illustrating an exemplary embodiment of a blue color photoelectric conversion device according.

FIG. 2B is a cross-sectional view illustrating an exemplary embodiment of a second blue color photoelectric conversion device 100'.

Referring to FIG. 2B, the second blue color photoelectric conversion device 100' includes a pair of first and second electrodes 111' and 112', respectively, and a blue color photoelectric conversion film 120' interposed between the first electrode 111' and the second electrode 112', wherein the first electrode 111' and the second electrode 112' are disposed spaced apart from each other. The blue color photoelectric conversion film 120' includes a p-type layer 121', a p,n-type layer 122' and an n-type layer 123', wherein the p-type layer 121' is formed by depositing tetraphenyl diamine ("TPD") on the first electrode 111', the p,n-type layer 122' is formed by co-depositing TPD and $C_{60}$ on the p-type layer 121', and the n-type layer 123' is formed by depositing NTCDA on the p,n-type layer 122'.

TPD can be used to form the p-type layer 121' by deposition. Also, TPD and $C_{60}$ can be used to form the p,n-type layer 122' on the p-type layer 121 by co-deposition. In addition, NTCDA can be used to form the n-type layer 123' on the p,n-type layer 122 by deposition. In an embodiment, the p,n-type layer 122' can comprise TPD and $C_{60}$, which can be mixed in a ratio of one to one. However, the present embodiment is not limited thereto.

The first electrode 111' can be disposed adjacent to the p-type layer 121' and the second electrode 112' can be disposed adjacent to the n-type layer 123'. In an embodiment, the first electrode 111' can be a transparent electrode comprising a material such as ITO, IZO, ZnO, $SnO_2$, ATO, AZO, GZO, $TiO_2$, FTO or the like, or a combination thereof. In an embodiment, the first electrode 111' can be a transparent electrode consisting essentially of a material such as ITO, IZO, ZnO, $SnO_2$, ATO, AZO, GZO, $TiO_2$, FTO or the like, or a combination thereof. In an embodiment, the first electrode 111' can be a transparent electrode consisting a material such as ITO, IZO, ZnO, $SnO_2$, ATO, AZO, GZO, $TiO_2$, FTO or the like, or a combination thereof. The second electrode 112' can be the same as the transparent electrode disclosed above or can be a metal electrode comprising a material such as Al, Cu, Ti, Au, Pt, Ag, Cr or the like, or a combination thereof. In an embodiment, the metal electrode can consist essentially of a material such as Al, Cu, Ti, Au, Pt, Ag, Cr or the like, or a combination thereof. In another embodiment, the metal electrode can consist of a material such as Al, Cu, Ti, Au, Pt, Ag, Cr or the like, or a combination thereof.

In the second blue color photoelectric conversion device 100', high external quantum efficiency is not be observed within a blue wavelength. However, when the second blue color photoelectric conversion device 100' is improved in the manufacture thereof, improved external quantum yield can be expected. In an embodiment, the blue color photoelectric conversion film 120' can comprise a p-type layer formed by depositing TPD and an n-type layer formed by depositing $C_{60}$ on the p-type layer. In an embodiment, the blue color photoelectric conversion film 120' can consist essentially of a p-type layer formed by depositing TPD and an n-type layer formed by depositing $C_{60}$ on the p-type layer. In an embodiment, the blue color photoelectric conversion film 120' can consist of a p-type layer formed by depositing TPD and an n-type layer formed by depositing $C_{60}$ on the p-type layer.

In order to improve the performance of the photoelectric conversion device, a buffer layer or a hole transfer layer can be further included between the first electrode 111' and the p-type layer 121', and a buffer layer or an electron transfer layer can be further included between the second electrode 112' and the n-type layer 123'.

Figure 2C:
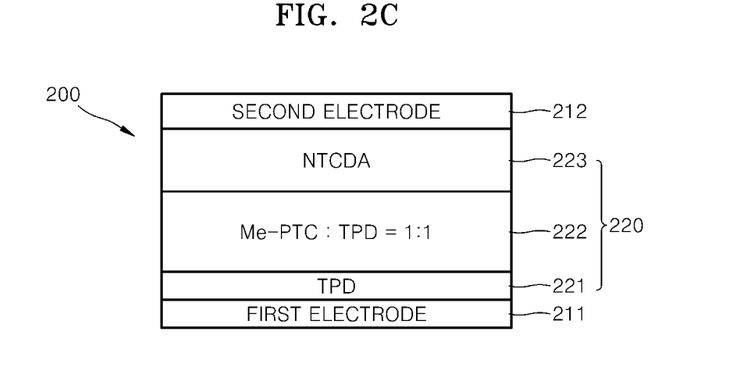
FIG. 2C is a cross-sectional view illustrating a green color photoelectric conversion device of FIG. 1.

FIG. 2C is a cross-sectional view illustrating an exemplary embodiment of the green color photoelectric conversion device 200 of FIG. 1.

Referring to FIG. 2C, the green color photoelectric conversion device 200 includes a pair of first and second electrodes 211 and 212, respectively, and a green color photoelectric conversion film 220 interposed between the first electrode 211 and the second electrode 212, wherein the first electrode 211 and the second electrode 212 are disposed spaced apart from each other. In an embodiment, the green color photoelectric conversion film 220 includes a p-type layer 221, a p,n-type layer 222 and an n-type layer 223, wherein the p-type layer 221 is formed by depositing TPD on the first electrode 211, the p,n-type layer 222 is formed by co-depositing TPD and N-methyl-3,4,9,10-perylenetetracarboxyl-diimide ("Me-PTC") on the p-type layer 221, and the n-type layer 223 is formed by depositing NTCDA on the p,n-type layer 222.

TPD can be used to form the p-type layer 221 by deposition. Also, TPD and Me-PTC can be used to form the p,n-type layer 222 on the p-type layer 221 by co-deposition. In addition, NTCDA can be used to form the n-type layer 223 on the p,n-type layer 222 by deposition. In an embodiment, the p,n-type layer 222 can comprise TPD and Me-PTC, which can be mixed in a ratio of one to one. However, the present embodiment is not limited thereto.

The first electrode 211 can be disposed adjacent to the p-type layer 221 and the second electrode 212 can be disposed adjacent to the n-type layer 223. In an embodiment, the first electrode 211 can be a transparent electrode comprising a material such as ITO, IZO, ZnO, $SnO_2$, ATO, AZO, GZO, $TiO_2$, FTO or the like, or a combination thereof. In an embodiment, the first electrode 211 can be a transparent electrode consisting essentially of a material such as ITO, IZO, ZnO, $SnO_2$, ATO, AZO, GZO, $TiO_2$, FTO or the like, or a combination thereof. In an embodiment, the first electrode 211 can be a transparent electrode consisting of a material such as ITO, IZO, ZnO, $SnO_2$, ATO, AZO, GZO, $TiO_2$, FTO or the like, or a combination thereof. The second electrode 212 can be the same as the transparent electrode described above or can be a metal electrode comprising a material such as Al, Cu, Ti, Au, Pt, Ag, Cr or the like, or a combination thereof. In an embodiment, the metal electrode can consist essentially of a material such as Al, Cu, Ti, Au, Pt, Ag, Cr or the like, or a combination thereof. In another embodiment, metal electrode can consist of a material such as Al, Cu, Ti, Au, Pt, Ag, Cr or the like, or a combination thereof.

In the green color photoelectric conversion device 200, high external quantum efficiency is not observed within a green wavelength region. However, when the green color photoelectric conversion device 200 is used along with the first blue color photoelectric conversion devices 100 and/or the second blue color photoelectric conversion device 100', the external quantum yield within a green wavelength region can be improved. Accordingly, the green color photoelectric conversion device 200 can be used along with the first and second blue color photoelectric conversion devices 100 and 100'. In an embodiment, the green color photoelectric conversion film 220 can comprise a p-type layer formed by depositing TPD and an n-type layer formed by depositing Me-PTC on the p-type layer. In an embodiment, the green color photoelectric conversion film 220 can consist essentially of a p-type layer formed by depositing TPD and an n-type layer formed by depositing Me-PTC on the p-type layer. In an embodiment, the green color photoelectric conversion film 220 can consist of a p-type layer formed by depositing TPD and an n-type layer formed by depositing Me-PTC on the p-type layer. In addition, in order to improve the performance of the photoelectric conversion device, a buffer layer or a hole transfer layer can be further included between the first electrode 211 and the p-type layer 221, and a buffer layer or an electron transfer layer can be further included between the second electrode 212 and the n-type layer 223.

The embodiments are further described in greater detail with reference to the following examples, which are for illustrative purposes and are not intended to limit the scope of the invention.

EXAMPLES

Example 1

Manufacture of the First Blue Color Photoelectric Conversion Device 100 illustrated in FIG. 2A Tetracene is deposited on a glass substrate, on which an ITO electrode (the first electrode 111) is disposed, to a thickness of 30 nm, to form the p-type layer 121. Then, tetracene and NTCDA are co-deposited on the p-type layer 121 to a thickness of 100 nm to form the p,n-type layer 122. Then, NTCDA is deposited on the p,n-type layer 122 to a thickness of 250 nm to form the n-type layer 123. Then, an Ag electrode (the second electrode 112) is disposed on the n-type layer 123 with a thickness of 20 nm. The glass substrate, on which the ITO electrode is disposed, is cleaned using water, ultrasonic waves, methanol and acetone. The cleaned glass substrate is then $O_2$ plasma processed. Then, a thermal evaporator is used to sequentially deposit organic materials on the ITO electrode disposed on the $O_2$ plasma processed glass substrate under a pressure of $1 \times 10^{-5}$ torr at a deposition speed of 2 angstroms per second ("Å/s") to form the blue color photoelectric conversion film 120 and an Ag metal electrode is deposited at a deposition speed of 4 Å/s.

Example 2

Manufacture of the Second Blue Color Photoelectric Conversion Device 100' Illustrated in FIG. 2B The second blue color photoelectric conversion device 100' is manufactured in the same manner as in Example 1, except that TPD is deposited to form the p-type layer 121', TPD and $C_{60}$ are co-deposited to form the p,n-type layer 122' and NTCDA is deposited to form the n-type layer 123'.

Example 3

Manufacture of the Green Color Photoelectric Conversion Device 200 illustrated in FIG. 2C The green color photoelectric conversion device 200 is manufactured in the same manner as in Example 1, except that TPD is deposited to form the p-type layer 221, TPD and Me-PTC are co-deposited to form the p,n-type layer 222 and NTCDA is deposited to form the n-type layer 223.

Electrical Characteristics Measurement

Figure 3A:
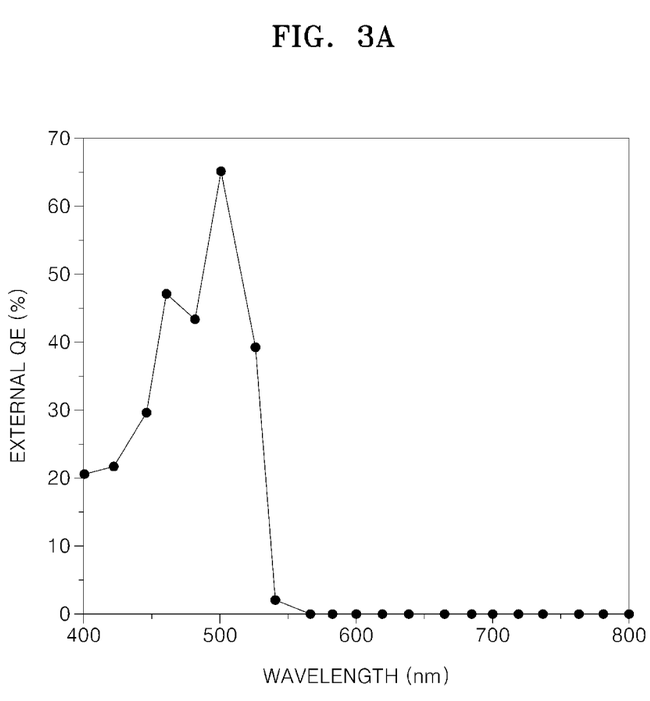
FIG. 3A is a graph showing an external quantum yield ("External QE") of the blue color photoelectric conversion device of FIG. 2A.
Figure 3B:
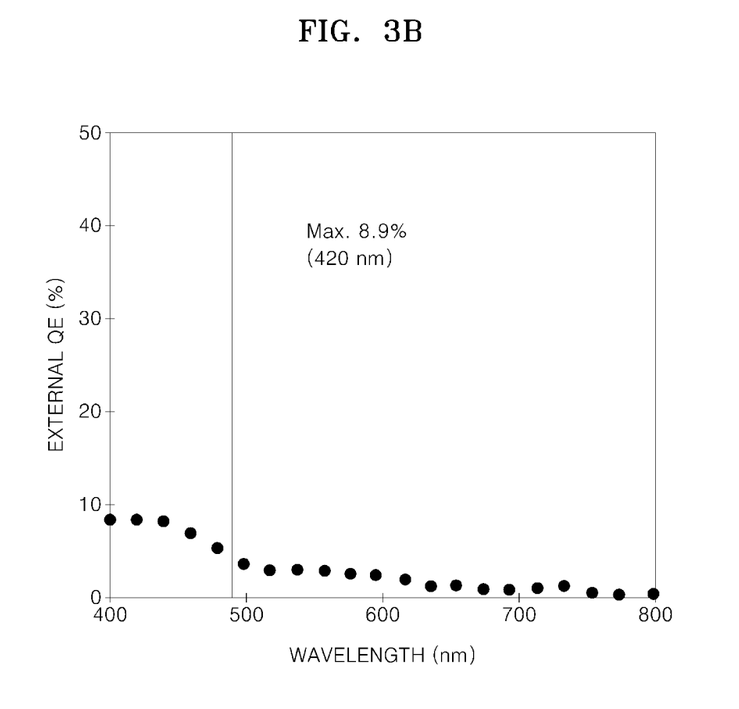
FIG. 3B is a graph showing an external quantum yield ("External QE") of the blue color photoelectric conversion device of FIG. 2B.
Figure 3C:
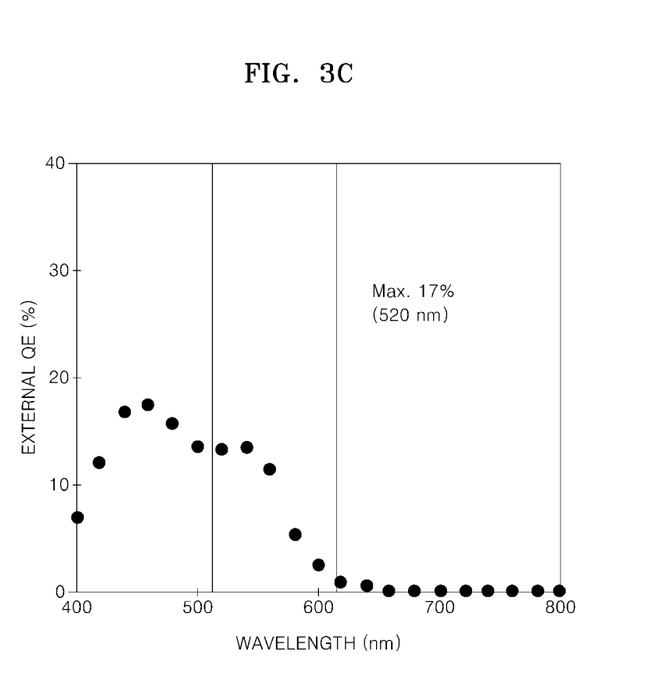
FIG. 3C is a graph showing an external quantum yield ("External QE") of the green color photoelectric conversion device of FIG. 2C.

An electrometer (Keithley model 485) is used to measure electrical characteristics of the photoelectric conversion devices manufactured as in Examples 1 through 3 under a pressure of $1\times10^{-5}$ torr and the results are shown in FIGS. 3A through 3C. A xenon lamp and a monochrometer are used to provide monochromatic light and a function generator (Hokudo Denko, Ltd., HB-104) is used. FIGS. 3A through 3C are graphs showing external quantum yields ("External QE") of the photoelectric conversion devices manufactured as in Examples 1 through 3. More specifically, FIG. 3A is a graph showing an external quantum yield ("External QE") of the first blue color photoelectric conversion device 100 manufactured in Example 1, FIG. 3B is a graph showing an external quantum yield ("External QE") of the second blue color photoelectric conversion device 100' manufactured in Example 2, and FIG. 3C is a graph showing an external quantum yield ("External QE") of the green color photoelectric conversion device 200 manufactured in Example 3.

Referring to FIG. 3A, in the first blue color photoelectric conversion device 100 manufactured in Example 1, the maximum external quantum yield of about 63% is observed at the wavelength of 500 nm and the external quantum yield of about 47% is observed near the wavelength of 460 nm. Due to of crosstalk, efficiency is significantly lower at a wavelength longer than about 500 nm. Referring to FIG. 3B, since an external quantum yield of about 9% is observed within a blue wavelength region in the second blue color photoelectric conversion device 100' manufactured in Example 2. However, when the blue color photoelectric conversion device 100' is optimized in the manufacture thereof, an improved external quantum yield may be expected. Referring to FIG. 3C, an external quantum yield of about 17% is observed within a green wavelength region for the green color photoelectric conversion device 200 manufactured in Example 3. However, when the green color photoelectric conversion device 200 is used along with the first and second blue color photoelectric conversion devices 100 and 100', the external quantum yield usable within a green wavelength region may be improved. Accordingly, the green color photoelectric conversion device 200 may be used along with the first photoelectric conversion device 100 and/or the second blue color photoelectric conversion device 100'.

As described above, according to the one or more of the above embodiments, selective photoelectric conversion for a blue wavelength or a green wavelength may be possible and a photoelectric conversion device having an organic thin film layered structure, which may have a high external quantum efficiency in a blue wavelength region may be manufactured. Thus, a high-definition charge coupled device ("CCD") or CMOS image sensor may be manufactured without using a color filter or an optical diode. The disclosed photoelectric conversion device may be used in digital cameras, broadcasting cameras, surveillance cameras, computer web cameras, camcorders, automotive sensors, household sensors and solar batteries.

It should be understood that the exemplary embodiments described therein should be considered in a descriptive sense only and not for purposes of limitation. The disclosed features or aspects of an embodiment are to be considered as available for other similar features or aspects of other embodiments.

While this disclosure describes exemplary embodiments, it will be understood by those skilled in the art that various changes can be made and equivalents can be substituted for elements thereof without departing from the scope of the disclosed embodiments. In addition, many modifications can be made to adapt a particular situation or material to the teachings of this disclosure without departing from the essential scope thereof. Therefore, it is intended that this disclosure not be limited to the particular embodiment disclosed as the best mode contemplated for carrying out this disclosure.

What is claimed is:

1. A blue color photoelectric conversion film comprising:
   a p-type layer formed by depositing tetraphenyl diamine;
   a p,n-type layer formed by co-depositing tetraphenyl diamine and $C_{60}$ on the p-type layer; and
   an n-type layer formed by depositing naphthalene-tetracarboxylic-dianhydride on the p,n-type layer.

2. A photoelectric conversion device comprising:
   a pair of electrodes; and
   the blue color photoelectric conversion film of claim 1 interposed between the pair of electrodes,
   wherein the pair of electrodes comprises a first electrode adjacent to the p-type layer and a second electrode adjacent to the n-type layer.

3. The photoelectric conversion device of claim 2, wherein the first electrode is a transparent electrode comprising indium tin oxide, indium zinc oxide, ZnO, $SnO_2$, antimony-doped tin oxide, Al-doped zinc oxide, gallium-doped zinc oxide, $TiO_2$, fluorine-doped tin oxide or a combination comprising at least one of the foregoing, and the second electrode is the transparent electrode or is a metal electrode comprising Al, Cu, Ti, Au, Pt, Ag, Cr or a combination comprising at least one of the foregoing.

4. The photoelectric conversion device of claim 2, further comprising a buffer layer, a hole transfer layer, or an electron transfer layer interposed between the first electrode and the blue color photoelectric conversion film or the second electrode and the blue color photoelectric conversion film.

5. A color image sensor comprising the photoelectric conversion device of claim 2.

6. A green color photoelectric conversion film comprising:
   a p-type layer formed by depositing tetraphenyl diamine;
   a p,n-type layer formed by co-depositing tetraphenyl diamine and N-methyl-3,4,9,10-perylenetetracarboxyl-diimide on the p-type layer; and
   an n-type layer formed by depositing naphthalene-tetracarboxylic-dianhydride on the p,n-type layer.

7. A photoelectric conversion device comprising:
   a pair of electrodes; and
   the green color photoelectric conversion film of claim 6 interposed between the pair of electrodes,
   wherein the pair of electrodes comprises a first electrode adjacent to the p-type layer and a second electrode adjacent to the n-type layer.

8. The photoelectric conversion device of claim 7, wherein the first electrode is a transparent electrode comprising indium tin oxide, indium zinc oxide, ZnO, $SnO_2$, antimony-doped tin oxide, Al-doped zinc oxide, gallium-doped zinc oxide, $TiO_2$, fluorine-doped tin oxide or a combination comprising at least one of the foregoing, and the second electrode is the same as transparent electrode or is a metal electrode comprising Al, Cu, Ti, Au, Pt, Ag, Cr or a combination comprising at least one of the foregoing.

9. The photoelectric conversion device of claim 7, further comprising a buffer layer, a hole transfer layer, or an electron transfer layer interposed between the first electrode and the green color photoelectric conversion film or the second electrode and green color photoelectric conversion film.

10. A color image sensor comprising the photoelectric conversion device of claim 7.

* * * * *